(12) United States Patent  (10) Patent No.: US 8,198,788 B2
Martin  (45) Date of Patent: Jun. 12, 2012

(54) SELF-CONTAINED U OR V SHAPED PIEZOELECTRIC DEVICE FOR GENERATING VOLTAGE

(76) Inventor: Jean-Frederic Martin, Cremieu (FR)

( * ) Notice: Subject to any disclaimer, the term of this patent is extended or adjusted under 35 U.S.C. 154(b) by 373 days.

(21) Appl. No.: 12/522,340

(22) PCT Filed: Jan. 18, 2008

(86) PCT No.: PCT/FR2008/050082
§ 371 (c)(1),
(2), (4) Date: Jul. 7, 2009

(87) PCT Pub. No.: WO2008/099122
PCT Pub. Date: Aug. 21, 2008

(65) Prior Publication Data
US 2010/0045143 A1  Feb. 25, 2010

(30) Foreign Application Priority Data
Jan. 24, 2007 (FR) ..................................... 07 52845

(51) Int. Cl.
*H01L 41/107* (2006.01)
*H02N 2/18* (2006.01)

(52) U.S. Cl. .......................... 310/339; 310/330; 310/331

(58) Field of Classification Search .......... 310/330–332, 310/339
See application file for complete search history.

(56) References Cited

U.S. PATENT DOCUMENTS

| 5,315,204 | A  | * | 5/1994  | Park ............................... 310/339 |
| 5,828,157 | A  |   | 10/1998 | Miki et al. |
| 7,005,778 | B2 |   | 2/2006  | Pistor |
| 8,040,023 | B2 | * | 10/2011 | Laermer et al. ............... 310/339 |
| 2005/0280561 | A1 |   | 12/2005 | Face et al. |
| 2009/0243254 | A1 | * | 10/2009 | Chiang et al. ................. 310/339 |
| 2009/0284102 | A1 | * | 11/2009 | Karakaya et al. ............. 310/339 |
| 2010/0219720 | A1 | * | 9/2010  | Namuduri et al. ............ 310/339 |
| 2010/0244629 | A1 | * | 9/2010  | Nagashima et al. .......... 310/339 |
| 2011/0109202 | A1 | * | 5/2011  | Martin .......................... 310/339 |

FOREIGN PATENT DOCUMENTS

| DE | 29614851 |   | 1/1997 |
| EP | 0725452  |   | 8/1996 |
| JP | 58204782 |   | 11/1983 |
| JP | 2006041150 | A | * 2/2006 |

OTHER PUBLICATIONS

European Patent Office, International Search Report, dated Oct. 8, 2008 (2 pgs. English language, 2 pgs. French language).

* cited by examiner

*Primary Examiner* — J. San Martin

(57) ABSTRACT

A piezoelectric device for generating a voltage, comprising a vibratory blade with a first end secured to a fixed substrate and a second, free end which can be moved by applying a mechanical pulse thereon. At least one separate piezoelectric element is provided on one side of blade in such a way that it is deformed by the oscillation of the blade following the application of said mechanical pulse, and thereby generates a voltage. The device is characterized in that the blade is generally U shaped and has two substantially planar arms joined together via a curved intermediate portion. A first arm is secured to the substrate and a second arm has the free end.

14 Claims, 2 Drawing Sheets

SELF-CONTAINED U OR V SHAPED PIEZOELECTRIC DEVICE FOR GENERATING VOLTAGE

CROSS REFERENCE TO RELATED APPLICATIONS

This application is a National Stage filing under 35 U.S.C. §371 of PCT Application No. PCT/FR2008/050082, filed on Jan. 18, 2008. This application also claims the benefit of French Application No. 0752845, filed on Jan. 24, 2007. The entirety of both applications is incorporated hereby reference.

FIELD OF INVENTION

The invention relates to the field of devices for generating electricity which use the conversion of mechanical or electrical energy by means of piezoelectric elements.

The invention relates more especially to a new mechanical architecture of such a device which confers major advantages in terms of efficiency and implementation in particular.

DESCRIPTION OF PRIOR ART

Generally speaking, many systems which use electrical or electronic components need to be self-sufficient in terms of energy, especially if they cannot be linked or connected to an external energy source. Examples of such systems include mobile devices as well as stationary devices or apparatus which are installed in locations where it is difficult, complicated or too expensive to lay a power cable.

Thus, many apparatuses are equipped with storage batteries or dry cells which provide electrical power. However, such storage batteries have a limited battery operation time and this means they must be replaced at regular intervals.

Proposals have been made to equip certain apparatuses with devices which make it possible to generate electrical energy by converting energy which is available in the vicinity of the apparatus. Examples include photovoltaic devices which convert luminous energy and devices based on piezoelectric elements which make it possible to convert mechanical energy into electrical energy as a result of the deformation of a piezoelectric element.

Many devices have already been suggested for generating electrical energy by exploiting the piezoelectric effect. Such devices generally include a vibratory blade fixed by one of its ends to a fixed substrate with the other free end being capable of moving due to the effect of a mechanical force which is applied to it. This force may originate, for instance, from the movement of a counterweight attached to the end of the blade, if the energy is recovered from a vibratory system, or from an external mechanical device which applies a point force to the end of the blade, thereby causing it to oscillate.

One or more piezoelectric elements are mounted on one or both sides of the blade and are therefore subjected to deformation as the blade oscillates. This deformation therefore produces an electrical voltage across the terminals of the piezoelectric element. This voltage can then be rectified in order to charge a capacitive component of the capacitor type in order to power a load. Such devices are described, for example, in Documents US 2005/0280561, EP 0 725 452, DE 296 14 851 U as well as in U.S. Pat. No. 7,005,778.

The one common feature of all these mechanisms is the fact that their operation is the result of deformation of a substantially straight beam which is fixed at one or both of its ends. Such a design has numerous drawbacks. In fact, from an energy standpoint, these systems have relatively poor efficiencies of the order of several percent at most. The term "efficiency" is taken to mean the ratio of the electrical energy supplied to the capacitive component located downstream from the piezoelectric component to the mechanical energy delivered to the system.

This poor efficiency therefore generally makes it necessary to increase the number of conversion systems in order to obtain a satisfactory quantity of electrical energy, thereby increasing the overall size of the conversion device as well as its cost.

Another drawback of vibratory beam systems is the fact that the point of attachment to the fixed substrate is subjected to considerable mechanical stresses because of the moment generated at the level of the end restraint and the propagation of vibrations into the substrate.

These mechanical stresses therefore make it necessary to ensure mechanically robust, bulky end restraint which increases the cost of the system and has an impact on its performance.

One of the objects of the invention is to produce a system which is simple in design yet offers efficiency which is markedly better than that of existing systems and can be manufactured at reasonable cost.

SUMMARY OF INVENTION

The invention therefore relates to a piezoelectric device for generating a voltage. In a known manner, such a device comprises a vibratory blade with a first end secured to a fixed substrate. This blade has a second free end which can be moved by exerting a mechanical force thereon. This blade comprises at least one separate piezoelectric element provided on one side of the blade. This element is deformed by oscillation of the blade following exertion of the mechanical force in question, thereby generating a voltage. This force can be a mechanical pulse applied to the blade by an external mechanism. This force may also involve the blade being oscillated by vibrations originating outside the system.

According to the invention, this device is characterised in that the blade is generally V-shaped and has two substantially planar arms joined together via a curved intermediate portion. A first arm is secured to the substrate and the second arm has the free end.

In other words, the invention involves using a blade which does not have a planar, substantially straight geometry as is the case with the prior art; instead it has a configuration which is curved or bent in a U or V shape. One of the arms of this curved blade is subjected to the mechanical pulse or is made to oscillate by external vibrations, thereby causing deformation of the blade which is secured to the substrate by its opposite arm. The area where the two arms join together acts as a spring thanks to preferential deformation which limits the mechanical stresses at the level of the blade's attachment point to the fixed substrate very considerably.

These stresses, especially the moment, can be virtually zero in cases where the two arms have similar lengths. Nevertheless, in certain situations, the arms may have different lengths in order to influence the ratio of the fundamental oscillation mode to the harmonic modes.

In practice, the curved blade may have a configuration in which the two arms are virtually parallel so as to form a U and at least form an angle of less than 45° relative to each other in order to have a V configuration.

It is possible to envisage different variants as far as the location(s) of the piezoelectric element(s) is/are concerned.

Preferably, this piezoelectric element may be located on the second arm, i.e. the arm which receives the mechanical pulse. In this case, the element may advantageously be located on the outer side of this arm, preferably on the side of this arm which is located close to the curved intermediate portion. More precisely, this piezoelectric element may be located in an area of the second arm which extends from the intermediate curved portion to a point located at a distance equal to 20 to 50% and preferably 25 to 35% of the length of the second arm. In other words, the piezoelectric element is preferably located in that half of the second arm which is located close to the intermediate portion. This preferred location area is especially advantageous for pulsed operation where the second arm is subjected to deformation.

In another variant, the piezoelectric element can be located on the first arm, i.e. the arm which is secured to the fixed substrate. Although efficiency is reduced compared with when the piezoelectric element is located on the second arm, this solution may be adopted in certain situations.

This piezoelectric element may be located on the inner side or outer side of this arm. For practical reasons, it is also preferable to locate piezoelectric elements on the outer side of the blade. Opting to locate the piezoelectric element close to the curved intermediate portion may also be advantageous.

In this case, various positions can be selected for the piezoelectric element, locating it more or less close to the intermediate portion or even closer to the attachment point and end restraint on the fixed substrate. Thus, in practice, the piezoelectric element may be located in an area of the first arm which extends from the intermediate portion to a point located at a distance equal to 20 to 50% and preferably 25 to 35% of the length of the first arm.

In a vibratory operating mode, i.e. when the device is located on a source of vibrations which propagate to the piezoelectric element, the preferred location area may have a reduced extent insofar as the device receives a quantity of energy for a longer duration. It is thus possible to obtain a significant level of energy recovery with only one piezoelectric element extending over 5 to 10% of the length of the arm on which it is located. Also, in a vibratory operating mode, it is possible to envisage positioning the piezoelectric element a certain distance away from the intermediate portion in order to limit the mechanical stresses exerted on said element, thereby increasing its service life without thereby compromising good efficiency.

It is also possible to combine these different variants by placing several piezoelectric elements on the vibratory blade, locating them on the first and on the second arm. Such combinations make it possible to obtain extremely useful efficiencies in excess of 25% compared with efficiencies of less than 3% which are observed on systems according to the prior art. In practice, for the sake of efficiency, preference is given to solutions whereby the piezoelectric element(s) is/are located at least on the second blade.

In practice, the piezoelectric element can be made of various materials, in particular, lead zirconate titanate (PZT) based materials, but also any other piezoelectric material, especially monocrystalline materials such as lead magnesium niobate and lead titanate (PNM-PT). In order to optimise efficiency, piezoelectric elements are selected which extend over almost the entire width of the blade, said blade being made of a material which has dynamic elastic strength properties which allow applications of the spring type as well as dimensional properties which are conducive to generating an oscillating regime and encouraging the propagation of vibrations. Examples include steels which have a "piano chord" type composition such as steel XC 75 S, in particular, or cold-worked stainless steel X 10C R Ni 18 8 (T4) having breaking strengths ($R_m$) in excess of 1100 MPa. It is also possible to use polymeric materials such as polyphenylene sulphide (PPS) for example.

BRIEF DESCRIPTION OF DRAWINGS

The way in which the invention is implemented and its resulting advantages will be readily apparent from the description of the following embodiments, reference being made to the accompanying drawings in which.

DESCRIPTION OF PREFERRED EMBODIMENTS

Figure 1:
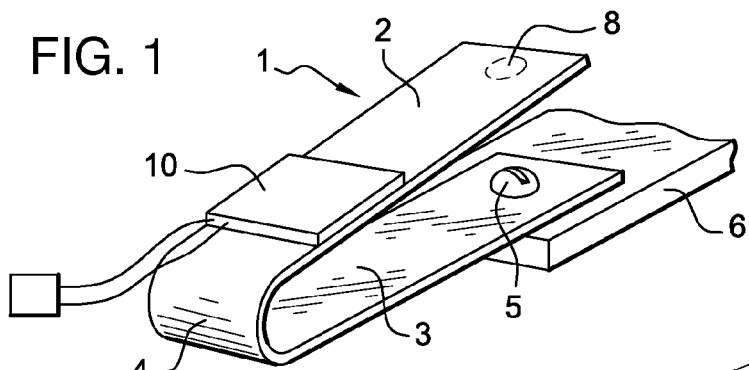
FIG. 1 is an overall view of the device according to the invention built in accordance with a V shaped first variant.
Figure 2:
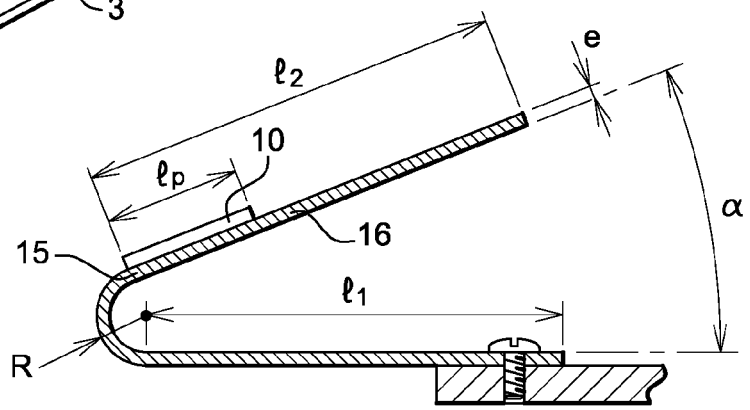
FIG. 2 is a side view of the V shaped device in FIG. 1.

The device according to the invention, shown in FIG. 1, is generally speaking in the form of a blade (1) made of a rigid material which is curved in a U shape (FIG. 5) or V shape (FIG. 2). More precisely, blade (1) comprises two substantially planar parts (2, 3) forming the arms of the U which are joined together via a curved intermediate portion (4). The first arm (3) is secured to a fixed substrate (6) by an end restraint (5). The second arm (2) has an end (8) capable of receiving a mechanical pulse which causes deformation of the blade, especially at the level of curved area (4) and then oscillating when the force is no longer applied with the blade tending to return to its initial position. Oscillation of the blade may also be the result of vibration from outside the system transmitted by the end restraint with the possibility of fitting a counterweight on free end (8).

According to the invention, blade (1) is associated with at least one piezoelectric element which, in the form shown in FIG. 1, is positioned on the outer side of the second arm (2). This piezoelectric element (10) is secured by a conventional bonding process, by using an epoxy adhesive for example.

In practice, various types of piezoelectric materials can be used depending on the desired application and required power ratings.

By way of example, good results have been obtained using piezoelectric materials of the lead zirconate titanate type or, more generally, all types of ceramics having a perovskite crystalline structure. More generally speaking, many piezoelectric materials can be used as long as they have a coupling coefficient $k_{31}$ higher than 0.3 and a mechanical quality factor higher than 150 in the case of pulsed operation or higher than 30 for recovering vibrational energy.

Figure 5:
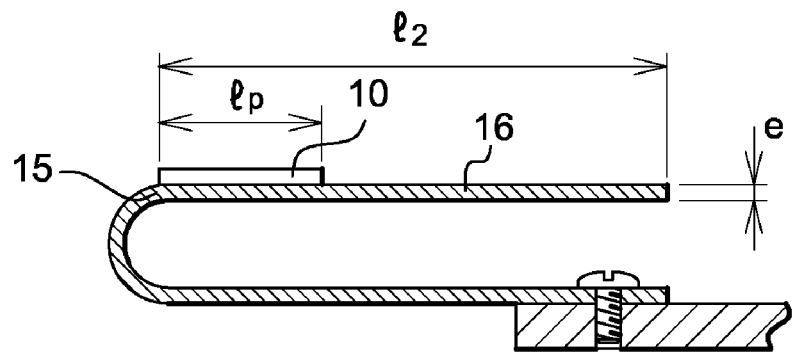
FIG. 5 is a side view of an U shaped device.

In practice, the dimensions and positioning of the various elements can be optimised in order to ensure maximum efficiency. Thus, as shown in FIGS. 2 and 5, the angle α which the two straight arms (2, 3) of the blade form relative to each other can be less than approximately 45° in order to minimise the torque and swivelling at the level of attachment point (5) when a mechanical pulse is applied to end (8) of arm (2). In an optimised form, this angle can be virtually zero, as shown more specifically in FIG. 5.

The length of the various arms (2, 3) also has an impact on the amplitude of the vibrations. The length $L_2$ of second arm (2) must be markedly longer than the width of the blade, especially in order to recover impulsive energy.

The positioning of piezoelectric element (10) on the second arm (2) of the blade also has an impact on the performance level achieved. It has been observed that it is advantageous to locate the piezoelectric element (10) in an area of the second arm which is as close as possible to curved intermediate portion (4). This optimal positioning area therefore extends, firstly, from the point (15) where second arm (2) joins intermediate curved portion (4) to, secondly, a second point (16) located at a distance equal to 20 to 50% of the length $L_2$ of second arm (2) from first point (15). The length $L_p$ of piezoelectric element (10) thus represents 20 to 50% of the length $L_2$ of second arm (2).

The bend radius (R) of curved intermediate portion (4) is as small as possible. In practice, it is approximately several millimeters depending, in particular, on the thickness (e) of the blade which is itself selected depending on the thickness of the element made of a piezoelectric material (10).

Figure 6:
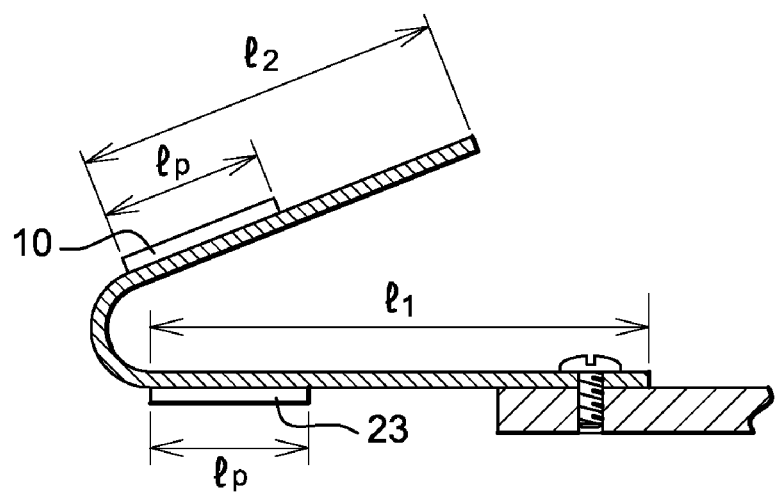

The length L1 of the first arm, the end of which is secured to substrate (6), can be selected so that it is substantially identical to length L2 of the second arm (2) if there is a requirement to minimise the torque exerted at the level of attachment point (5) when the mechanical pulse is applied or during free oscillation of the blade. Nevertheless, using a first arm (3) having a different length, as shown in FIG. 6, can have an effect on the amplitude of the harmonics of the signal output by piezoelectric element (10) and hence the efficiency of the device.

In practice, piezoelectric element (10) may be made by associating several separate piezoelectric elements in parallel.

Figure 3:
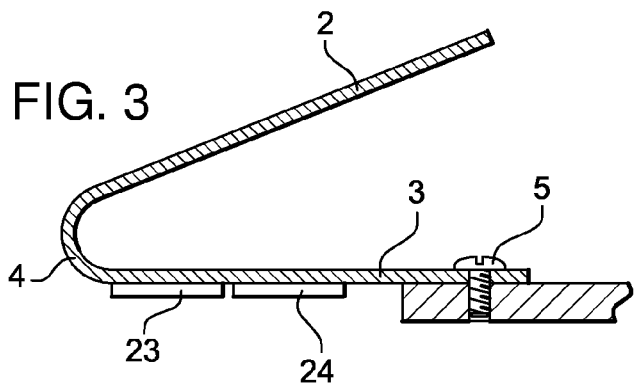
FIGS. 3, 4 and 6 are side views of alternative embodiments.

As stated above, the piezoelectric element(s) can be located in various positions on the blade, especially on first arm (3) as shown in FIG. 3. The piezoelectric element(s) (23, 24) can be bonded on the outer side of first arm (3) either in close proximity to curved intermediate portion (4) as far as element (23) is concerned or closer to attachment point (5) as far as piezoelectric element (24) is concerned. The length of each of these elements and their precise positioning depend on the overall geometry of the blade and its modes of vibration and are chosen so as to optimise its energy efficiency.

Figure 4:
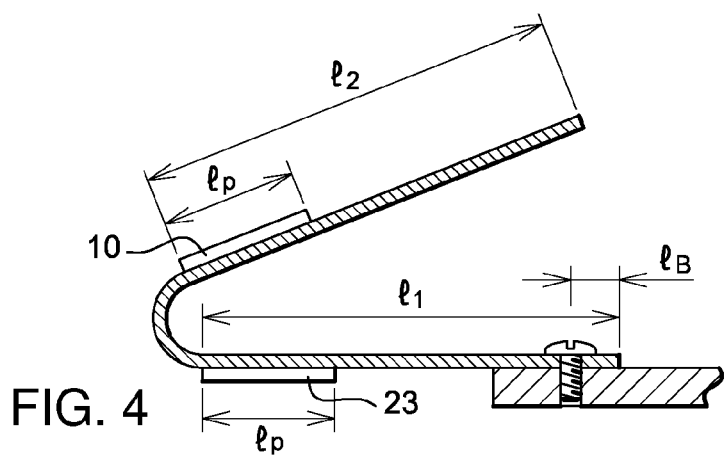

Good results have been obtained using the configuration shown in FIG. 4 where the piezoelectric elements are located on the two arms of the blade. A first piezoelectric element (10) is located on the second blade and a second element (23) is located on the outer side of the first blade close to the curved portion (4). More precisely, the description of the particular embodiment which follows is given with specified dimensional details only in order to demonstrate the advantage of the invention in terms of efficiency. The elastic blade chosen is based on a spring steel of the X 10 C R Ni 18 8 stainless steel type and has a thickness (e) of 0.9 mm and a width of 25 mm. The length L of the second arm (2) is 83 mm. The neutral axis radius of the curved area (4) is 2.65 mm. The first restrained arm (3) has a length of 85 mm, given that the end-restraint point (5) is located at a distance (d) of 33 mm relative to the free end of the first arm (3). The piezoelectric elements used are located at the end of their respective arms close to the curved portion (4). The piezoelectric elements used are of the PZT ceramic type. The elements are used in pairs and each have a width of 25 mm which matches the width of the blade, a length of 10 mm and a thickness of 0.3 mm. Their polarisation direction is parallel to their thickness. It is possible to calculate the efficiency of the device as the ratio of the electrical energy collected on the output of the piezoelectric elements, after rectification and storage in a capacitor, to the mechanical energy delivered to the system. More precisely, the mechanical energy delivered to the system corresponds to a force having an amplitude (F) which is applied to the end (8) of the free arm in order to cause a displacement excursion (f). In a test with an excursion of 4.4 mm, the measured mechanical energy was 10.5 mJ. The electrical energy supplied by the piezoelectric elements is stored in a capacitance formed by a 5.3 µF capacitor after rectification by a standard diode bridge. The measured voltage is around 35.5 V and so the corresponding efficiency is approximately 32%. Another test with a deflection of 4.9 mm and a mechanical energy of 13.78 mJ made it possible to recover 3.5 mJ from a 3.3 µF capacitor brought to a voltage of 45.86 V, which is equivalent to an efficiency slightly better than 25%. Other capacitance values can be selected depending on the electrical constraints of the device, especially in order to avoid excessively high voltages.

Obviously, this example is given merely by way of illustration and does not restrict the scope of the invention in any way whatsoever; the invention has an extremely wide variety of alternative forms which are all in accordance with the principles of the invention as stated above.

Such a device has many advantages, including the following:

Electromechanical coupling k greater than that achieved by the prior art and using a limited quantity of piezoelectric material;

A mechanical quality factor which is defined at the time of design and is, for instance, in excess of around 100 when recovering impulsive energy;

A mechanical torque generated at the level of the end-restraint point, which is especially small or even zero, thus eliminating risks of the device swivelling when the blade is compressed;

The use of common types of piezoelectric materials which can be used in smaller quantities, thus providing a corresponding cost saving;

The use of commonly available materials in order to realise the vibratory blade;

A simple manufacturing method which produces a highly reliable device;

Very good efficiency compared with existing system;

An estimated service life of several decades; and

An ecologically sustainable and durable energy recovery system

INDUSTRIAL APPLICATIONS

Such a device can be widely used as an electrical power source which replaces storage batteries and dry cells, especially lithium batteries, for wireless sensor network applications or for any application that requires a self-sufficient energy source which has a long service life.

Typical applications include instruments for measuring physical parameters in industries which use petrochemical or pharmaceutical type processes. Other applications include, in particular, temperature, pressure or flow rate sensors, especially in water or gas distribution systems. Other applications involve electrical appliances of the electric switch type, cordless door chimes or devices to detect opening. Miniaturised versions of the invention can also be used to power micro-electro-mechanical systems (MEMS).

The invention claimed is:

1. A piezoelectric device for generating a voltage, the device comprising:

a vibratory blade having a first substantially planar arm and a second substantially planar arm joined together via a curved intermediate portion, the first arm and the second arm forming an angle of less than 45° relative to one another;

a first end of the first arm being secured to a fixed substrate; and a second, free end of the second arm which can be moved by exerting a mechanical force thereon, wherein at least one separate piezoelectric element is provided on one side of the blade in such a way that it is deformed by the oscillation of the blade following the exertion of said mechanical force, and thereby generates a voltage.

2. The device as claimed in claim 1, wherein the two arms are substantially parallel relative to each other.

3. The device as claimed in claim 1, wherein the two arms form a V shape or a U shape.

4. The device as claimed in claim 1, wherein at least one of the piezoelectric elements is located on the second arm.

5. The device as claimed in claim 4, wherein at least one of the piezoelectric elements is located in an area of the second arm which extends from the intermediate curved portion to a point located at a distance equal to 20 to 50% of the length of the second arm.

6. The device as claimed in claim 4, wherein at least one of the piezoelectric elements is located in an area of the second arm which extends from the intermediate curved portion to a point located at a distance equal to 25 to 35% of the length of the second arm.

7. The device as claimed in claim 1, wherein at least one of the piezoelectric elements is located on an outer side of the second arm.

8. The device as claimed in claim 1, wherein at least one of the piezoelectric elements is located on an inner side or an outer side of the first arm.

9. The device as claimed in claim 8, wherein at least one of the piezoelectric elements is located in an area of the first arm which extends from the intermediate curved portion to a point located at a distance equal to 20 to 50% of the length of the first arm.

10. The device as claimed in claim 8, wherein at least one of the piezoelectric elements is located in an area of the first arm which extends from the intermediate curved portion to a point located at a distance equal to 25 to 35% of the length of the first arm.

11. The device as claimed in claim 1, wherein several of the piezoelectric elements are located on the first arm and on the second arm.

12. The device as claimed in claim 1, wherein at least one of the piezoelectric elements extends over virtually the entire width of the blade.

13. The device as claimed in claim 1, wherein the two arms are of substantially equal length.

14. The device as claimed in claim 1, wherein the two arms have different lengths.

* * * * *